United States Patent [19]

Rice et al.

[11] Patent Number: 4,923,407
[45] Date of Patent: May 8, 1990

[54] ADJUSTABLE LOW INDUCTANCE PROBE

[75] Inventors: Delbert L. Rice; Steven E. Soar, both of Vancouver, Wash.

[73] Assignee: Tektronix, Inc., Beaverton, Oreg.

[21] Appl. No.: 415,825

[22] Filed: Oct. 2, 1989

[51] Int. Cl.⁵ ........................ H01R 4/66; H01R 11/88
[52] U.S. Cl. ...................................... 439/92; 439/482; 439/98; 324/72.5; 324/158 P
[58] Field of Search .................. 439/98, 482, 481, 92, 439/108; 324/72.5, 158 P, 149

[56] References Cited

U.S. PATENT DOCUMENTS

| | | | |
|---|---|---|---|
| 2,912,647 | 11/1959 | Krystek | 324/72.5 |
| 3,265,969 | 8/1966 | Catu | 324/72.5 |
| 4,838,802 | 6/1989 | Soar | 439/98 |

FOREIGN PATENT DOCUMENTS

| | | | |
|---|---|---|---|
| 3005255 | 8/1981 | Fed. Rep. of Germany ... | 324/158 P |
| 358934 | 3/1906 | France ................. | 439/482 |

OTHER PUBLICATIONS

"Scope Probe", IBM Technical Disclosure Bulletin, vol. 7, No. 5, Oct. 1964.

Primary Examiner—Gary F. Paumen
Attorney, Agent, or Firm—Peter J. Meza

[57] ABSTRACT

A low inductance probe contains a signal probe shaft having a signal probe point and an adjacent ground conductor or conductive shield for placing on the circuit location which is desired to be measured, a ground probe arm having a ground probe point for placing on a convenient ground location. The ground probe arm is attached to the signal probe shaft by means of a hinge which enable the ground probe arm to rotate between zero and approximately 135 degrees in a compass like fashion. The ground conductor of the signal probe shaft and the ground probe point of the ground probe arm are electrically connected by means of a low inductance ground lead consisting of a monolithic, flexible strand of conductive foil.

9 Claims, 3 Drawing Sheets

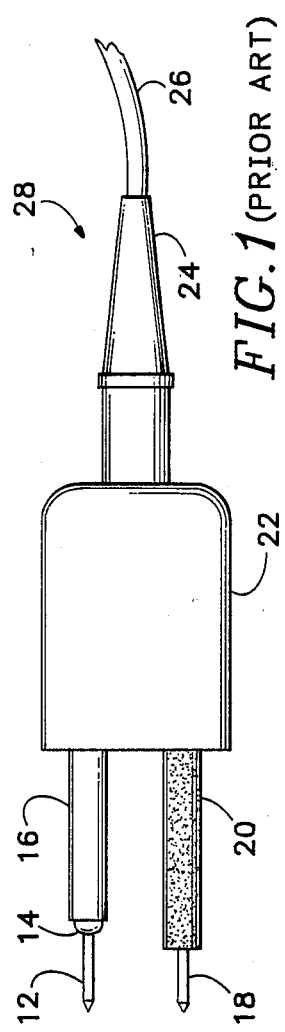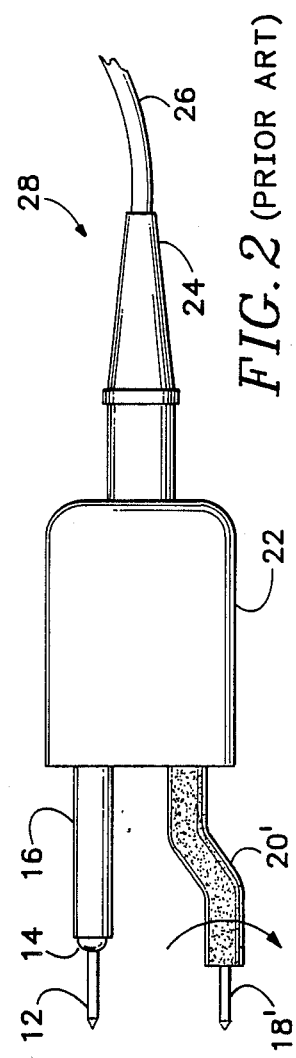

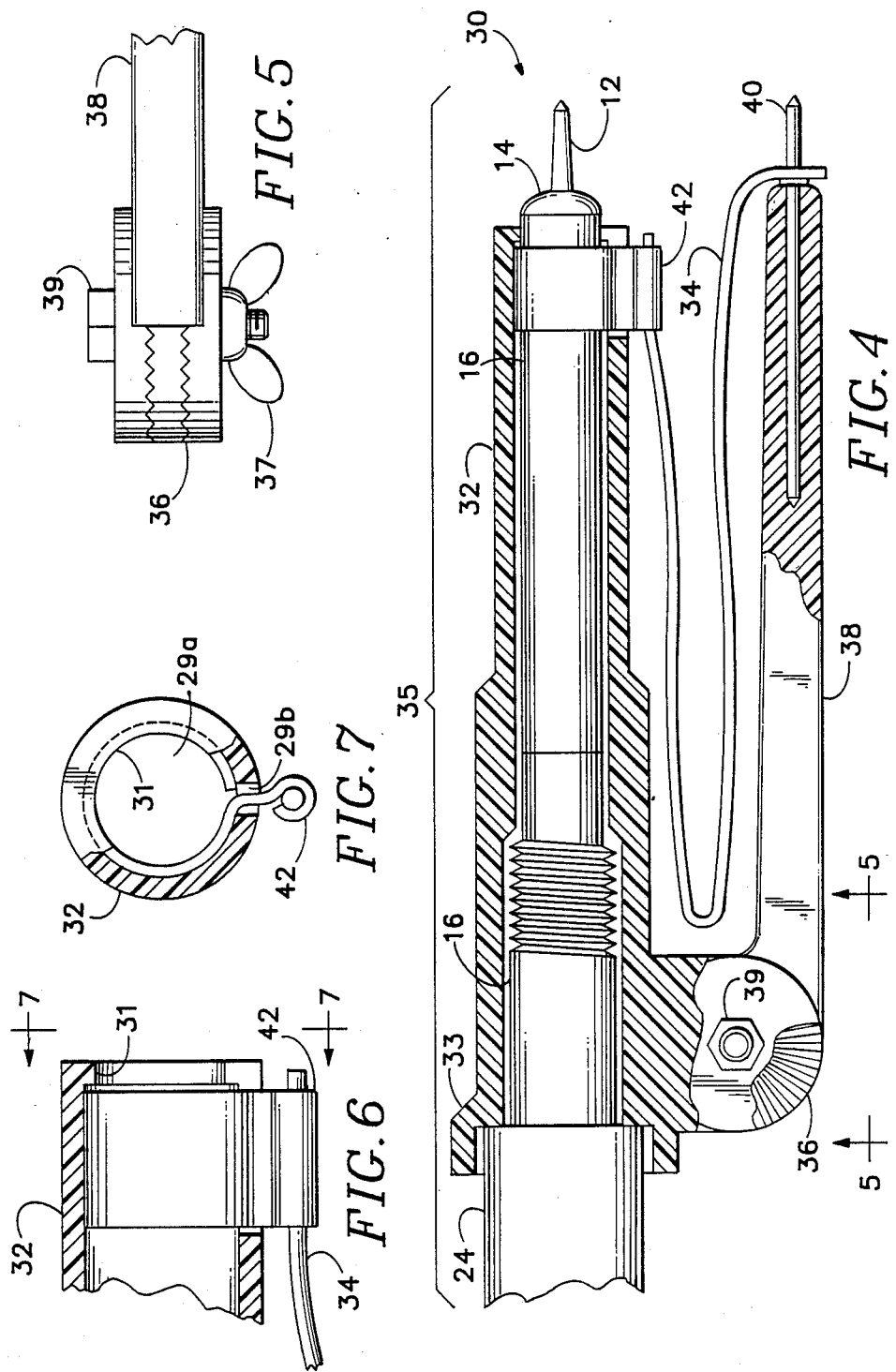

ADJUSTABLE LOW INDUCTANCE PROBE

BACKGROUND OF THE INVENTION

This invention relates to low inductance probes, and more particularly to low inductance probes in which the distance between the signal probe point and the ground probe point is adjustable.

A typical prior art probe 10 is shown in FIG. 1. A signal is measured with a signal probe consisting of signal probe point 12, which is insulated by insulator 14, and shielded from electromagnetic interference by conductive shield 16. A signal conductor (not shown) is in electrical contact with the signal probe point 12 and extends the length of the shield 16 and into the probe grip 22. A ground probe consists of ground probe point 18 which is used to contact a circuit ground location and establish a reference for the measured signal. The ground probe point is insulated by insulator 20. A ground conductor (not shown) is in electrical contact with the ground probe point and extends the length of insulator 20 into the probe grip 22. Inside the probe grip 22, the ground conductor is attached to the shield 16. The signal conductor and the shield 16 form a shielded cable 26. A cable guard 24 may be used to prevent excessive wear at the point which the shielded cable 26 exits the probe grip 22. Although the prior art probe 10 can be made to have relatively low inductance in series with the ground probe point 18, the distance between ground probe point 18 and signal probe point 12 is fixed. Thus, prior art probe 10 cannot be used to make measurements where the desired measuring location is other than a fixed distance from a convenient ground location.

Another prior art probe 28 is shown in FIG. 2. As in the probe of FIG. 1, probe 28 contains a signal probe consisting of a signal probe point 12, an insulator 14, and a conductive shield 16. Similarly, a ground probe known as a "Z" lead consists of ground probe point 18' which is used to contact a circuit ground location and establish a reference for the measured signal insulated by insulator 20'. However, in probe 28, the ground probe not only makes electrical contact with shield 16, but is free to rotate along its axis with probe grip 22. Therefore, the distance between the signal probe point 12 and ground probe point 18' is not fixed but can be set to various points determined by the amount that the ground probe is rotated away from its center axis. The prior art probe 28 can also be made to have relatively low inductance in series with the ground probe point 18'. However, due to the freedom of movement of the ground probe, in actual use prior art probe 28 is hard to manipulate, especially with one hand. Also, the range of distances between the signal probe point 12 and the ground probe point 18' is limited. Thus, prior art probe 28 cannot be conveniently used to make measurements and cannot make measurements at all where the desired measuring location is far from a convenient ground location.

What is desired is a low inductance probe where the distance between the signal probe point and the ground probe point is adjustable over a wide range, and measurements can be made conveniently using one hand.

SUMMARY OF THE INVENTION

In accordance with the present invention, a low inductance probe contains a signal probe shaft having a signal probe point and an adjacent ground conductor or conductive shield for placing on the circuit location which is desired to be measured, and a ground probe arm having a ground probe point for placing on a convenient ground location. The ground probe arm is attached to the signal probe shaft by means of a hinge which enable the ground probe arm to rotate between zero and approximately 135 degrees in a compass like fashion. The ground conductor of the signal probe shaft and the ground probe point of the ground probe arm are electrically connected by means of a low inductance ground lead consisting of a monolithic, flexible strand of conductive foil.

The distance between the signal probe point and the ground probe point is adjustable over a wide range, and the probe may be conveniently manipulated with one hand.

BRIEF DESCRIPTION OF THE DRAWINGS

For a better understanding of the invention, and to show how the same may be carried into effect, reference will now be made to the accompanying drawing, in which:

FIG. 1 is a side view of a prior art probe in which the signal probe point and the ground probe point are fixed;

FIG. 2 is a side view of a prior art probe in which the ground probe point is free to move about a central axis;

FIG. 4 is a cutaway view of the low inductance probe in accordance with the present invention;

FIG. 5 is a sectional view of a hinge along line 5—5 of FIG. 4;

FIG. 6 is a cutaway view of a probe grip including a ring collar; and

FIG. 7 is a section view of the probe grip along line 7—7 of FIG. 6.

DESCRIPTION OF THE PREFERRED EMBODIMENT

Figure 3:
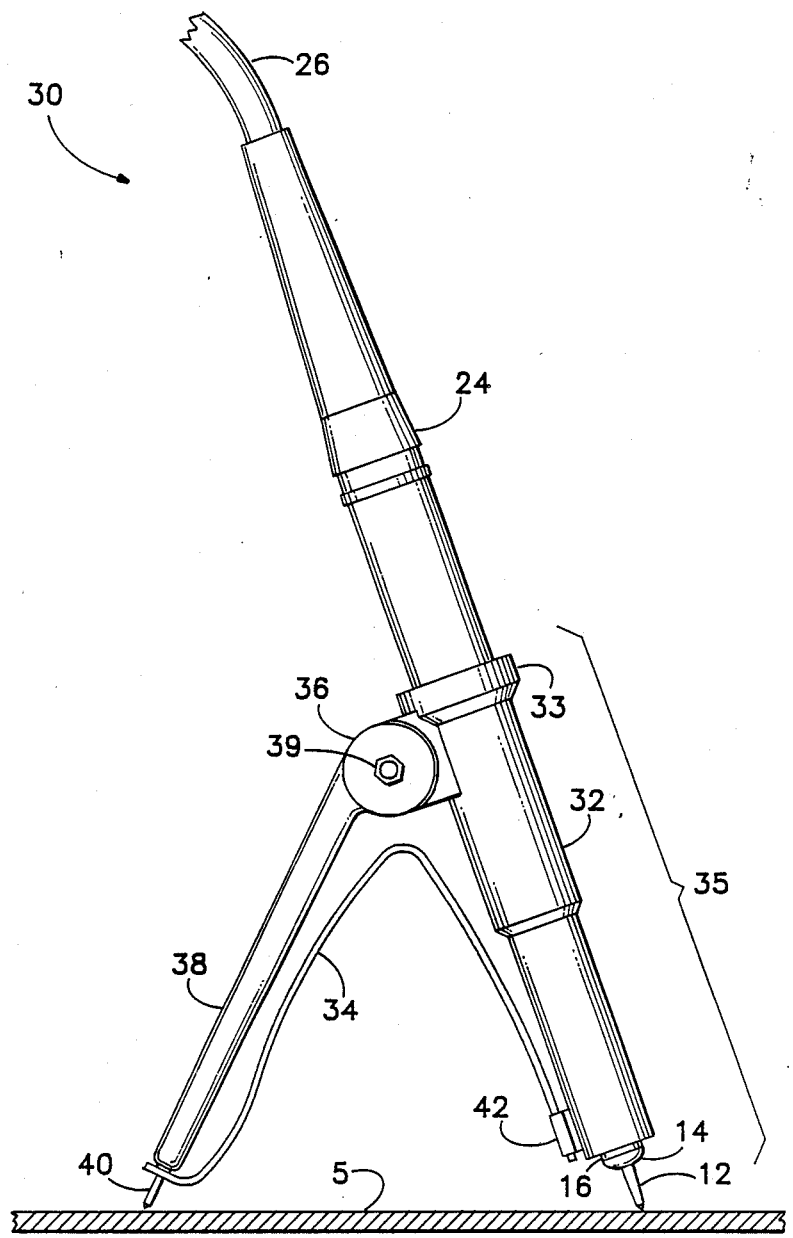
FIG. 3 is a side view of a low inductance probe in a measurement environment in accordance with the present invention in which the distance between the signal probe point and the ground point is adjustable.

Referring now to FIG. 3, an adjustable low inductance probe 30 according to the present invention is shown in a typical measurement environment such as circuit board 5. A signal on circuit board 5 is measured with a signal probe shaft 35 consisting of signal probe point 12, which is insulated by insulator 14, and shielded from electromagnetic interference by conductive shield 16. The conductive shield 16 extends the length of signal probe shaft 35. An insulated signal conductor (not shown) is in electrical contact with the signal probe point 12 and also extends the length of signal probe shaft 35. Probe grip 32 covers the entire length of conductive shield 16 and terminates in a raised portion 33. The raised portion 33 increases the arc creepage distance between the voltage on shield 16 and earth ground, which may be important if the conductive shield is "floated" with respective to earth ground.

A ground probe arm 38 contains a ground probe point 40 that is used to contact a circuit ground location and establish a reference for the measured signal. The ground probe arm 38 terminates in hinge 36 that attaches ground probe arm 38 to the probe grip 32. Hinge 36 may be secured by bolt 39 and a nut (not shown).

A ring collar 42 that is electrically connected to conductive shield 16 is electrically connected to ground probe point 40 by means of a low inductance ground lead 34. The low inductance ground lead 34 is a monolithic, flexible strand of conductive foil having a maximum self inductance of about 20 nanohenries per inch. Such a low inductance ground lead is described in U.S. Pat. No. 4,838,802 entitled "Low Inductance Ground Lead", to Steven E. Soar issued June 13, 1989, and is hereby incorporated by reference. The low inductance ground lead may be fabricated of flat flex copper strip sandwiched between layers of polyamide or polymer film. It is desirable that the low inductance ground lead 34 and ring collar 42 be attached as close as possible to the end of shield 16 and ground probe point 40 and that ground lead 34 be fabricated as a foil and not a wire in order that minimum lead inductance may be achieved.

The signal conductor and the shield 16 form a shielded cable 26. As in prior art cables, a cable guard 24 may be used to prevent excessive wear at the point which the shielded cable 26 exits the probe grip 32.

The ground probe arm 38 is attached to the signal probe shaft 35 by hinge 36 in such a manner that the ground probe arm 38 is free to rotate through an angle of approximately 135 degrees. The rotation of the ground probe arm 38 enables measurement of circuit locations that are close to a ground location and measurement of circuit locations that are far from a ground location, limited only by the length of the signal probe shaft 35 and the ground probe arm 38. The compass like structure of the low inductance probe 30 enables the user to conveniently make measurements with one hand.

A cutaway view of the low inductance probe 30 in FIG. 4 clearly shows the position of ring collar 42 relative to the conductive shield 16 and the ratchet nature of hinge 36. The ring collar 42 surrounds conductive shield 16 close to signal probe point 12 in order that a minimum ground lead length through low inductance ground lead 34 to ground probe point 40 is maintained. Ground probe arm 38 is shown in a partial cutaway view. A partial cutaway view of hinge 36 shows raised areas that form a ratchet hinge. The angle of the ground probe arm 38 to the probe shaft 35 may be maintained by securing the hinge 36 with bolt 39 and wing nut 37 (not shown). Probe grip 32 and raised portion 33 are shown in a cutaway view, with the raised portion in contact with cable guard 24.

FIG. 5 is a sectional view of FIG. 4 along lines 5—5 revealing further details of hinge 36. A middle movable portion of the hinge with raised areas is coupled to ground probe arm 38, with two outer stationary portions of the hinge having matching raised portions being coupled to probe grip 32. The portions are joined together to form a ratchet hinge that may be secured with a tension adjusting means such as a bolt 39 and wing nut 37.

Greater detail of ring collar 42 is shown in FIG. 6. Probe grip 32 is shown to have a lip 31 that secures ring collar 42. The portion of ring collar extending beyond probe grip 32 is attached to low inductance ground lead 34 by suitable means such as soldering. A sectional view of probe grip 32 and ring collar 42 taken along lines 7—7 is shown in FIG. 7. Ring collar 42 is clamped and inserted through hole 29a and slot 29b in probe grip 32.

Once inserted, ring collar 42 expands and is constrained by lip 31.

For maximum performance it is desirable that signal probe point 12 and ground probe point 40 be constructed of gold plated beryllium copper. As an alternative to the rigid pins shown in the drawing figures, "plunger pins" or spring loaded pins of any commercially available type may be substituted. Insulator 14 may be constructed of glass filled polycarbonate or polypropylene. Probe grip 32 and ground probe arm 38 may be constructed of glass filled nylon plastic. Ideally, ring collar 42 is constructed of beryllium copper. Conductive shield 16 may be brass and plated with a copper-tin-zinc alloy. Cable guard 24 may be fabricated out of rubber, flexible vinyl, or rubber modified olefin polymer.

It should be noted that the preferred embodiment shown and described herein is intended as merely illustrative and not as restrictive of the invention, and many changes and modification thereof may occur to those skilled in the art. For example, the exact shape and size of the probe grip 32, the hinge 36, and the ground probe arm 38 may be changed without departing from the scope of the invention.

We claim:

1. High frequency electrical signal measurement probe apparatus, comprising:
    (a) a signal probe shaft having a signal probe point and an adjacent conductive shield;
    (b) a ground probe arm having a ground probe point;
    (c) hinge means that rotatably attaches said ground probe arm to said signal probe shaft; and
    (d) a low inductance ground lead interconnecting the conductive shield of said signal probe shaft and the ground probe point of said ground probe arm.

2. The probe apparatus of claim 1, wherein the low inductance ground lead comprises a monolithic, flexible strand of conductive foil having a maximum self inductance of about 20 nanohenries per inch.

3. The probe apparatus of claim 2, wherein the low inductance ground lead comprises flat flex copper strip sandwiched between two layers of polyamide film.

4. The probe apparatus of claim 1, wherein the signal probe shaft further comprises a ring collar surrounding the conductive shield, the ring collar being coupled to said low inductance ground lead.

5. The probe apparatus of claim 1, wherein the hinge means comprises a molded hinge.

6. The probe apparatus of claim 5, wherein the molded hinge further comprises a movable portion having raised areas, and a stationary portion having matching raised areas to form a ratchet hinge.

7. The probe apparatus of claim 5, wherein the molded hinge allows extension to a maximum angle of 135 degrees between the probe shaft and the ground probe arm.

8. The probe apparatus of claim 5, wherein the molded hinge further comprises tension adjusting means.

9. The probe apparatus of claim 8, wherein the tension adjusting means comprises a bolt and a wing nut.

* * * * *